United States Patent [19]

Levine

[11] 4,042,891
[45] Aug. 16, 1977

[54] FREQUENCY SYNTHESIZER HAVING FREQUENCY CONTROL LOOP INCLUDING FIBER OPTIC DELAY LINE

[75] Inventor: Arnold M. Levine, Chatsworth, Calif.

[73] Assignee: International Telephone and Telegraph Corporation, New York, N.Y.

[21] Appl. No.: 710,165

[22] Filed: July 30, 1976

[51] Int. Cl.$^2$ .............................................. H03B 3/04
[52] U.S. Cl. ...................................... 331/1 R; 331/9; 331/175
[58] Field of Search .................. 331/1 R, 9, 10, 25, 331/107 A, 175, DIG. 1; 350/96 R, 96 B, 96 WG; 250/199

[56] References Cited

U.S. PATENT DOCUMENTS

| 3,809,908 | 5/1974 | Clanton | 250/199 X |
| 3,852,681 | 12/1974 | Underhill | 331/1 R |

FOREIGN PATENT DOCUMENTS

| 1,268,953 | 12/1968 | U.S.S.R. | 331/1 |

OTHER PUBLICATIONS

Underhill, "Delay-Stabilized Variable Oscillator", Electronics Letters, vol. 8, Mar. 9, 1972.

Primary Examiner—Siegfried H. Grimm
Attorney, Agent, or Firm—William T. O'Neil

[57] ABSTRACT

A frequency synthesizer or programmable multiple frequency source which uses a voltage-controlled oscillator (VCO) responsive to an independent control variable. The VCO is also responsive to control from an error loop circuit which derives an additional control voltage as a result of comparing the VCO frequency at any time with one of the phase delay multiples of a fiber optic delay line. The independent variable used to select an overall frequency desired controls the VCO directly to an approximate frequency and the fiber optic delay line and error generating loop associated therewith operates as an automatic vernier on the VCO to bring it into phase-lock with the nearest frequency which is a multiple of the reciprocal of the fiber optic line delay time.

10 Claims, 1 Drawing Figure

FREQUENCY SYTHESIZER
BLOCK DIAGRAM

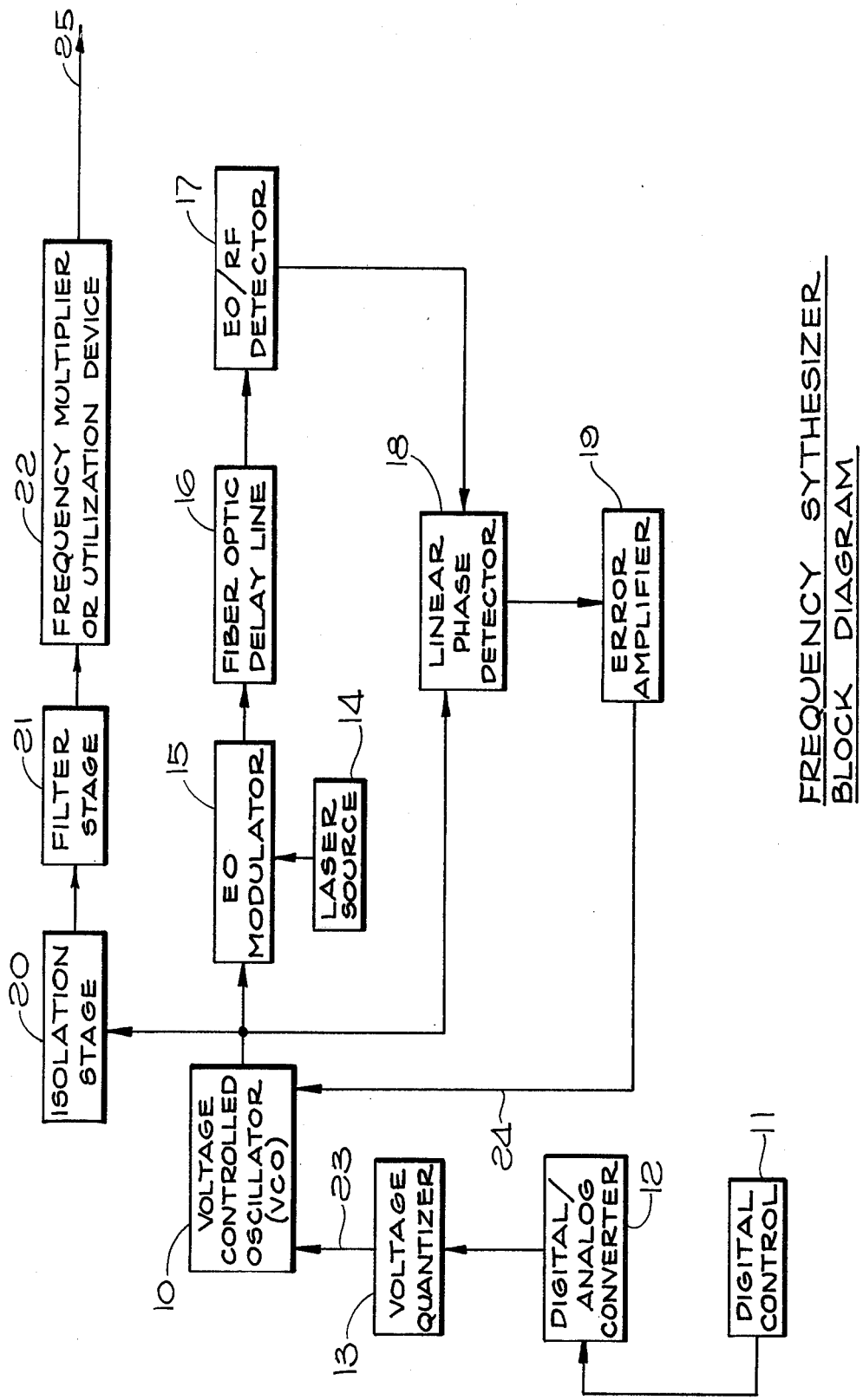
FREQUENCY SYTHESIZER
BLOCK DIAGRAM

FREQUENCY SYNTHESIZER HAVING FREQUENCY CONTROL LOOP INCLUDING FIBER OPTIC DELAY LINE

BACKGROUND OF THE INVENTION

1. Field of the Invention

The invention relates to radio frequency signal generation generally and more particularly to programmed sources for selecting frequencies as a function of a characteristic of an independent variable.

2. Description of the Prior Art

In the prior art, the programmable or selectable frequency source per se has a number of uses. One rather obvious application for such a device is the communications field. There a transmitter or receiver local oscillator frequency frequently must be accurately tuned through a number of discrete frequencies by an independent variable control voltage.

Other devices, such as frequency scanning radars, also require the rapid sequencing of frequency and the very accurate placement of the discrete frequencies involved.

Where a high order of accuracy and repeatability of the programmed frequencies generated by a frequency synthesizer are required, a natural choice has often been to employ banks of crystal oscillators and a switching and mixing system. The frequency stability of crystal oscillators is well known to be relatively good if temperature control and certain other precautions are employed. Because the oscillating crystal (usually quartz) utilizes the so-called piezoelectric effect, there is an actual mechanical supersonic wave or vibration involved. This makes the device subject to failure as a result of certain environmental factors and also to attritional deterioration of the quartz material of the crystal and the connections thereto. Also, the oscillating quartz crystal is subject to a relatively low upper operation frequency limitation, and accordingly where the programmable frequencies are required to be in the UHF or even microwave regions, much frequency multiplication must be employed.

The net result of such frequency synthesizer structures is therefore relatively high cost, complexity and magnification of variations.

Another known device which may be referred to as the delay-stabilized oscillator has been described in the technical literature, for example in the publication "Electronics Letters" (Mar. 9, 1972—Vol. 8, No. 5). That periodical is published by the Institution of Electrical Engineers (Great Britain). A very similar device is also described in British Pat. No. 1,325,219.

Basically, this so called delay-stabilized variable oscillator operates on the principle that the delay line used provides a phase shift which is proportional to frequency. Thus a linear phase detector (which has an output linearly proportional to phase difference), when connected to measure the phase shift in the delay line will give a voltage output which is also linearly proportional to frequency. If this voltage is compared with a variable reference voltage, an error signal can be developed to change the frequency of a voltage controlled oscillator to equalize these voltages.

The output of a phase detector obviously cannot discriminate between phase shifts differing by integral multiples of $2\pi$ radians, and accordingly, if the delay line used is such that many wavelengths of the input frequency are contained therein, a number of different discrete frequencies will satisfy the aforementioned criteria.

In the aforementioned prior art form of delayed-stabilized variable oscillator, a Pal (phase alternation line) is employed, this being an ultrasonic delay line, and therefore generally subject to the same type of environmental influences which influence the stability and accuracy of the ordinary crystal oscillator. It will be seen however, that the aforementioned delay-stabilized variable oscillator does however provide a significant advance in instrumentation simplicity and cost reduction.

In such systems as frequency scan radar, the instantaneous beam position is dependent on the frequency of the radar. Accordingly, a series of programmed base frequencies is required for scanning. A requirement for high angular accuracy in such a system coupled with the fact that the frequency synthesizer generating this series of frequencies is usually frequency multiplied upward to reach the microwave band employed by the radar, impose very stringent accuracy and stability requirements on the frequency synthesizer. While crystal oscillators, and Pal or SAW devices are relatively stable and reliable, they still leave much to be desired in that regard.

The manner in which the present invention develops and improves upon the prior art situation as aforesaid will be evident as this description proceeds.

In addition to the prior art aforementioned, the state of the art in respect to such light-transmissive optic fibers as are contemplated for use in connection with the present invention is summarized and explained in an article "Fiber Optic Communications: A Survey" by C. P. Sandbank, appearing in "Electrical Communication" Volume 50, No. 1, 1975 a technical journal published by International Telephone and Telegraph Corporation. That article also reviews the state of the art in respect to transmittable light sources, light-beam modulation means, and appropriate demodulation devices, as will be seen to be employed in a novel combination hereinafter described. Other technical publications are also extant on these matters, the skilled practitioner being thereby able to select the appropriate detailed structure therefor.

SUMMARY OF THE INVENTION

The novel combination of the present invention makes use of the extraordinarily stable and accurate light transmission delay provided by a fiber optic quartz material (glass) delay line uniquely applied to a voltage controlled oscillator. Unlike the prior art devices for accomplishing similar frequency program generation, the present invention produces the required delay which stabilizes the voltage controlled oscillator, in the light energy domain. Thus there are no mechanical vibrations (ultrasonic conversion) as there are in piezoelectric devices in general, and accordingly there is a very significant improvement in reliability. A fiber optical delay line, particularly when the glass materials specially developed for the purpose are used, is known to be extraordinarily stable and free of the effects of environmental factors such as temperature, shock and vibration, etc. over long periods of time as well as in the short term.

Basically, the combination of the invention involves a voltage controlled oscillator (VCO) which is approximately directed to the desired frequency in the series or programmed frequencies to be generated, by a control voltage (signal having a characteristic representative of the desired frequency). The characteristic of the controlled signal might be voltage, current (as would be common in connection with solid state circuitry) or the binary value of a digital word which is converted to a voltage or current, for example, for controlling the oscillator. In general, in using the term "voltage-controlled oscillator " the equivalent current control is also intended.

The output of the voltage controlled oscillator is used to modulate an optical source and this modulated light energy signal is passed through a fiber optic line and thereafter converted to an electrical signal by an optical (or light)-to-electrical transducer. The output of this transducer is then the signal at the output of the VCO phase delayed by a predetermined amount, which is then compared in a linear phase detector with the undelayed output of the voltage controlled oscillator. An error signal is developed by this phase detector which is used as a vernier or overriding control signal (second control signal) to constrain the VCO to "lock-in" on a frequency dictated by this delay.

The phase delay produced through the optical delay line cannot distinguish among delays $\theta$ and $\pi + 2K$, where $K$ is a multiple of $2\pi$ radians. If the coarse control of the voltage controlled oscillator, as aforementioned, is sufficiently close to the corresponding desired frequency in the program, there will be a capture effect, locking the VCO very accurately to the desired frequency step. Quite obviously the frequency outputs of the synthesizer according to the invention are integrally related.

The details of implementation of the present invention are hereinafter described in a typical arrangement.

BRIEF DESCRIPTION OF THE DRAWING

A single FIGURE showing a schematic block diagram of a frequency synthesizer according to the present invention is presented.

DESCRIPTION OF THE PREFERRED EMBODIMENT

Referring now to the FIGURE, a typical voltage controlled oscillator 10 is shown. This oscillator is arranged to be controllable by a first (coarse) control signal on lead 23 assumed to be developed from a digital control device 11 which may be thought of as the independent variable in this system. The digital number supplied by 11 is converted to analog form by a straightforward digital-to-analog converter 12 which supplies an analog voltage to the quantizer 13. This quanizer adjusts for scale factor and interface with the oscillator 10, such that each discrete condition of the digital signal from 11 represents a desired frequency within the program at the output of voltage controlled oscillator 10, even though it produces that frequency only approximately.

An isolation stage 20 and filter stage 21 operate to isolate the VCO 10 from circuit interactions and to improve the output signal-to-noise ratio, respectively. The output of 21 is shown supplied to a frequency multiplier or utilization device 22. Depending upon the type of application for which the system of the present invention is used, 22 may be a communication device or the like directly, or if the synthesizer is generating a program of frequencies for a frequency scanning radar system, at least some multiplication is likely to be required in 22. As this description proceeds, it will be understood however that this frequency multiplication is significantly less than required by prior art devices, because the VCO of the device according to the invention may operate at a much higher frequency than can prior art synthesizer. Accordingly, the output 25 might only be double the frequency of the VCO 10 or at most a relatively small multiple thereof.

As hereinbefore indicated, a second control signal is applied to the voltage control oscillator 10 at 24, this second signal providing the accurate "lock-in" control aforementioned. The output of 10 is supplied to an optical modulator 15 which impresses the oscillations from 10 as modulation on a light energy signal. This light energy signal is shown generated by a laser source 14, however in the broad context of the invention, another type of light source might be employed. The high energy light level from a laser is particularly useful however in order to keep optical signal levels relatively high through the fiber optic delay line 16 and into the detector 17.

The fiber optic delay line 16 may actually constitute a single fiber of optical glass (borosilicate No. 511365 material) wound on a spool in order to provide the required delay line length in a small physical size. The single optical fiber may be no more than a "thread-like" optical glass strand, the particular form being known in the corresponding art. At the output of 16, a demodulator (also called a detector or light-to-electrical transducer) extracts the delayed VCO output signal from the light carrier and applies it to the linear phase detector 18, where it is phase compared directly with the undelayed output of 10.

As previously indicated the present invention contemplates the operation of this locking loop on a certain phase equality plus a multiple of $2\pi$ radians at the output of 17. From this, it will be realized that there are locking or "capture" points at the multiples of $2\pi$ radians, and accordingly the delay of 16 is predetermined such that it corresponds to (or is a function of) the spacing between successive frequencies of the desired freqency program.

Once the capture effect has taken place, i.e. the second control signal on 24 has caused the VCO to accurately "lock-in" on a frequency determined precisely by the characteristics of the fiber optic line 16, this frequency continues to be generated until the coarse control signal on 23 departs sufficiently from its approximate value for that particular "lock-in" condition to re-establish a new frequency for VCO 10 and a new "lock-in" condition at another frequency in the said program.

It will be realized that the selection of frequencies in the program need not be according to a linear progression, but can be pseudo-random, interlaced or otherwise varied to suit the particular application.

The error amplifier 19 responds directly to the error signal from 18 to produce the control signal on 24 and from an understanding of the description thus far presented, it will be realized that the gain of 19 determines the "tightness" of this control loop.

Where the settling time required in switching from one frequency to another is a problem, as it may be in some fast-switching frequency programs, a duplicate synthesizer may be provided, suitably programmed so that alternate required synthesizer frequencies are produced by alternate synthesizers whose outputs are electronically switched to the utilization device. In this way the frequency switching may be accomplished in each synthesizer with sufficient lead time to allow for circuit settle-down.

As compared to frequency synthesizers which rely on banks of straightforward crystal oscillators necessarily operating at much lower frequencies than the required UHF or microwave application, for example, there is a very great reduction in overall equipment required through use of the present invention. Not only are the frequency multiplying requirements greatly reduced or even eliminated, but also the basic frequency generator is significantly simplified and inherently more reliable and accurate. In particular, the stability of the device of the present invention as a function of temperature could be expected to be at least 10 to 1 improved as compared to either the multiple crystal bank prior art frequency synthesizer or even as compared to the delay stabilized variable oscillator previously referred to. This is because both of those prior art implementations rely on ultrasonic devices basically, whereas the present invention relies on the known environmental stability of a fiber-optic delay line. Any ultrasonic oscillator or delay line is inherently susceptible to the type of failure relating to the fact that it is basically electromechanical in nature. Such failure can be induced in crystal oscillators, SAW devices, or Pal delay lines by various effects, such as loosening of electrical connections bonded thereto, for example, over a period of time.

The device of the present invention will be recognized as inherently capable of operating at VHF, UHF, and even microwave bands with little or no upward frequency multiplication and this is a very distinct advantage from the point of view of cost and equipment complexity. As herein before indicated, none of the relatively accurate prior art frequency synthesizers produce such signals without extensive frequency multiplication. Such multiplication is not only a complicating and cost increasing factor, but also inherently magnifies the effect of basic oscillator instabilities.

Various additional modifications and variations are obviously possible and will suggest themselves to those skilled in these arts once the nature of the present invention is understood. For just one further example, frequency multiplication or division prior to the fiber optical delay line is obviously possible.

Accordingly, it is not intended that the scope of the present invention should be regarded as limited to the embodiment shown and described in the drawing and this description, these being typical or illustrative only.

What is claimed is:

1. A frequency synthesizer for generating a program of discrete radio frequencies as a function of a characteristic of a control signal, said frequencies in said program each being a predetermined frequency corresponding to a predetermined condition of said control signal characteristic, comprising:
   an oscillator for generating said radio frequencies, said oscillator being signal controllable;
   means responsive to said control signal to control said oscillator frequency approximately to said predetermined frequency during each of said corresponding predetermined control signal conditions;
   a frequency control loop including an optical delay line with a source of light energy and input electric-to-light and output light-to-electric transducers, said input transducer modulating the output of said source of light energy at said oscillator frequency, said optical delay line having a delay time which is a function of the frequency separation between adjacent ones of said predetermined frequencies in said program, said loop also including means for comparing the period of said oscillator frequency with that of a precise frequency which is a function of a multiple of said delay time to generate and apply a second control signal to said oscillator thereby constraining said oscillator to provide an output frequency at said precise frequency with a high degree of accuracy.

2. A device for generating a program of discrete, accurately placed frequencies in response to a corresponding control signal, comprising:
   a voltage controlled oscillator responsive to said control signal as a coarse control for setting the frequency of said oscillator approximately to the corresponding frequency in said program;
   first means comprising a fiber optic delay line, a light signal source for transmitting light energy through said delay line, and means for modulating said light energy in response to the output of said oscillator to produce an accurately delayed output light signal modulated by said oscillator frequency;
   second means responsive to the output of said first means, comprising a light-to-electric signal transducer to produce an oscillator signal demodulated from said light energy, a phase detector responsive directly to said oscillator frequency and to the output of said light-to-electrical signal transducer to generate an error signal and to apply said error signal as an additional control signal to said oscillator to constrain the frequency of said oscillator to be determined as a function of at least a unity multiple of the delay provided by said fiber optic delay line.

3. Apparatus according to claim 2 in which said phase detector is further defined as being linear over a predetermined phase difference between its input signals on both sides of zero phase difference of said inputs.

4. Apparatus according to claim 2 in which an error amplifier is included responsive to the output of said phase detector, the output of said amplifier generating said additional control signal as an amplifier error signal thereby to increase the control accuracy afforded by the control loop comprising said oscillator and said first and second means.

5. Apparatus according to claim 2 in which said source of light energy is a laser source.

6. Apparatus according to claim 3 in which an error amplifier is included responsive to the output of said phase detector, the output of said amplifier generating said additional control signal as an amplified error signal thereby to increase the control accuracy afforded by the control loop comprising said oscillator and said first and second means.

7. Apparatus according to claim 2 in which said control signal is provided as a digital signal and digital-to-analog means are provided to convert said digital signal to an analog control signal for providing said coarse control approximately setting the frequency of said oscillator.

8. Apparatus according to claim 4 in which said control signal is provided as a digital signal and digital-to-analog means are provided to convert said digital signal to an analog control signal for approximately setting the frequency of said oscillator.

9. Apparatus according to claim 1 in which said means for comparing the period of said oscillator frequency with that of said precise frequency which is a function of a multiple of said delay time is a linear phase detector.

10. Apparatus according to claim 9 in which said optical delay line is a fiber optic cable of at least a single strand.

* * * * *